United States Patent [19]
Yoon et al.

[11] Patent Number: 5,304,503
[45] Date of Patent: Apr. 19, 1994

[54] SELF-ALIGNED STACKED GATE EPROM CELL USING TANTALUM OXIDE CONTROL GATE DIELECTRIC

[75] Inventors: Euisik Yoon, Sunnyvale; Albert M. Bergemont, San Jose; Ronald P. Kovacs, Mountain View, all of Calif.

[73] Assignee: National Semiconductor Corporation, Santa Clara, Calif.

[21] Appl. No.: 959,665

[22] Filed: Oct. 13, 1992

Related U.S. Application Data

[63] Continuation-in-part of Ser. No. 747,663, Aug. 20, 1991, abandoned.

[51] Int. Cl.$^5$ .................. H01L 27/115; H01L 21/265
[52] U.S. Cl. ........................ 437/43; 437/48; 257/315
[58] Field of Search ............ 437/43, 48, 49, 978; 257/315

[56] References Cited

U.S. PATENT DOCUMENTS

| | | | |
|---|---|---|---|
| 4,688,078 | 8/1987 | Hseih | 357/23.5 |
| 4,698,787 | 10/1987 | Mukherjee et al. | 365/185 |
| 4,794,565 | 12/1988 | Wu et al. | 365/185 |
| 5,021,848 | 6/1991 | Chiu | 357/23.5 |
| 5,120,670 | 6/1992 | Bergmont | 437/43 |
| 5,156,990 | 10/1992 | Mitchell | 437/43 |
| 5,225,359 | 7/1993 | DeLong | 437/39 |
| 5,240,870 | 8/1993 | Bergemont | 437/43 |

*Primary Examiner*—Olik Chaudhuri
*Assistant Examiner*—Richard A. Booth
*Attorney, Agent, or Firm*—Limbach & Limbach

[57] ABSTRACT

A process flow for fabricating a self-aligned stacked gate EPROM cell that uses a CVD tantalum oxide film to replace ONO as a control gate dielectric. Tungsten replaces polysilicon as the control gate. Both the dielectric deposition and cell definition steps of the process flow are performed in a back-end module to improve dielectric integrity in the memory cells by minimizing high temperature exposure of the tantalum oxide film.

12 Claims, 8 Drawing Sheets

---

16M EPROM PROCESS
(w/ ONO Control Gate)

Twin-Well Implant
Field Oxidation

- Floating Gate Oxidation
- Poly1 Deposition
- ONO Deposition
- Pattern ONO/Poly1
- n+ Bit Line Implant
- Differential Oxidation
- Etch ONO/Poly1 in Circuit Region CMOS Gate Oxide
Poly2 Deposition

- Pattern Poly2 (both cell & circuit)
- Self-Aligned Etch Pattern
- Etch ONO/Poly1 (floating gate)

S/D Oxidation
LDD n and p Implant
LDD Spacer & S/D Reoxidation
n+ and p+ Implant
BPSG Deposition/Reflow Contact Pattern
Metal 1
SOG Planarization
Via Etch
Metal 2
Passivation
Pad Etch Standard CMOS Process
• EPROM Modular Process

---

64M EPROM PROCESS
(w/ Ta$_2$O$_5$ Control Gate)

Twin-Well Implant
Field Oxidation

- Floating Gate Oxidation
- Poly1 Deposition
- ONO Deposition
- Pattern ONO/Poly1
- n+ Bit Line Implant
- Differential Oxidation
- Etch ONO/Poly1 in Circuit Region

CMOS Gate Oxide
Poly2 Deposition

- Pattern Poly2 (only circuit)
  (keep Poly2 in array)

S/D Oxidation
LDD n and p Implant
LDD Spacer & S/D Reoxidation
n+ and p+ Implant

- Pattern Circuit Protection
- Strip Poly2/ONO in Cell Region
- Deposit Ta$_2$O$_5$
- Deposit W Control Gate
- Pattern W/Ta$_2$O$_5$
- Self-Aligned Poly1 Etch (floating gate)
- TEOS Spacer Formation
- BPSG Deposition/RTP Reflow Contact Pattern
Metal 1
SOG Planarization
Via Etch
Metal 2
Passivation
Pad Etch

16M EPROM PROCESS
(w/ ONO Control Gate)

Twin-Well Implant
Field Oxidation

* Floating Gate Oxidation
* Poly1 Deposition
* ONO Deposition
* Pattern ONO/Poly1
* n+ Bit Line Implant
* Differential Oxidation
* Etch ONO/Poly1 in Circuit Region CMOS Gate Oxide
Poly2 Deposition

* Pattern Poly2 (both cell & circuit)
* Self-Aligned Etch Pattern
* Etch ONO/Poly1 (floating gate)

S/D Oxidation
LDD n and p Implant
LDD Spacer & S/D Reoxidation
n+ and p+ Implant
BPSG Deposition/Reflow Contact Pattern
Metal 1
SOG Planarization
Via Etch
Metal 2
Passivation
Pad Etch Standard CMOS Process
* EPROM Modular Process

64M EPROM PROCESS
(w/ $Ta_2O_5$ Control Gate)

Twin-Well Implant
Field Oxidation

* Floating Gate Oxidation
* Poly1 Deposition
* ONO Deposition
* Pattern ONO/Poly1
* n+ Bit Line Implant
* Differential Oxidation
* Etch ONO/Poly1 in Circuit Region CMOS Gate Oxide
Poly2 Deposition

* Pattern Poly2 (only circuit)
  (keep Poly2 in array)

S/D Oxidation
LDD n and p Implant
LDD Spacer & S/D Reoxidation
n+ and p+ Implant

* Pattern Circuit Protection
* Strip Poly2/ONO in Cell Region
* Deposit $Ta_2O_5$
* Deposit W Control Gate
* Pattern W/$Ta_2O_5$
* Self-Aligned Poly1 Etch
  (floating gate)
* TEOS Spacer Formation
* BPSG Deposition/RTP Reflow Contact Pattern
Metal 1
SOG Planarization
Via Etch
Metal 2
Passivation
Pad Etch

SELF-ALIGNED STACKED GATE EPROM CELL USING TANTALUM OXIDE CONTROL GATE DIELECTRIC

RELATED APPLICATION

This application is a continuation-in-part of prior U.S. application Ser. No. 747,663, filed on Aug. 20, 1991, now abandoned, by Euisik Yoon et al for SELF-ALIGNED STACKED GATE EPROM CELL USING TANTALUM OXIDE CONTROL GATE DIELECTRIC.

BACKGROUND OF THE INVENTION

1. Field of the Invention

The present invention relates to erasable programmable read only memory (EPROM) cell structures and, in particular, to a high density EPROM cell that substitutes tantalum oxide for conventional oxide-nitride-oxide ONO) composite as the control gate dielectric.

2. Discussion of the Prior Art

Traditionally, advances in the reduction of EPROM memory size have concentrated on pushing the limits of optical lithography and plasma etching in implementing the industry standard T-cell EPROM structures. These approaches, however, require the use of complicated technologies such as trench isolation schemes and local interconnects.

Self-aligned submicron cell structures have been recently introduced for multi-megabit high-density EPROMs. Examples of such cells are disclosed in the following publications: (1) A. T. Mitchell et al., "A New Self-Aligned Planar Array Cell for Ultra High Density EPROMs", *IEDM Tech. Digest*, pp. 548–551, 1987; (2) O. Belleza et al., "A New Self-Aligned Field Oxide for Multimegabit EPROMs", *IEDM Tech. Digest*, pp. 579–582, 1989; and (3) A. Bergemont et al., "A High Performance CMOS Process for Submicron 16 Meg EPROM", *IEDM Tech. Digest*, pp. 591–594, 1989.

Although these structures have proven the feasibility of 16 Meg EPROM cells in small geometries, the planarization of bit lines in the Mitchell et al. array and the reduction of bird's beak isolation in both the Belleza et al. and Bergemont et al. arrays still remain as major problems in further scaledown.

To address these problems, Bergemont has proposed a self-aligned, stack-etched cross-point EPROM cell for integration in a 16 Meg EPROM virtual ground array; A. Bergemont, "Process Flow Using Stacked Gate Process for Cross Point EPROM Cell with Internal Access Transistor", U.S. patent app. Ser. No. 687,176, filed Apr. 18, 1991 and commonly-assigned herewith.

However, beyond 16 Megabit densities, current oxide-nitride-oxide (ONO) control gate dielectric layers cannot be scaled down properly due to the low coupling ratio and high critical field introduced across the ONO. Therefore, it is necessary to develop a process flow for high density memories at the 64 Meg density level, and beyond, that uses a high dielectric material to replace the conventional ONO layers.

Recently, tantalum oxide has been extensively studied as a promising dielectric film for high-density DRAM applications because of its high dielectric constant (four or five times higher than that of silicon dioxide) and its dielectric strength. See, for example, S. Zaima et al., "Preparation and Properties of $Ta_2O_5$ Films by LPCVD for ULSI Application", *J. Electrochemical Soc.*, Vol. 137, No. 4, pp. 1297–1300, April 1990 and H. Shinriki et al., "UV-03 and Dry $O_2$: Two-Step Annealed Chemical Vapor-Deposited $Ta_2O_5$ Films for Storage Dielectrics of 64 Mb DRAM's", IEEE Trans. on Electron Devices, Vol. 38, No. 8, pp. 455–462, March 1991.

Figure 1:
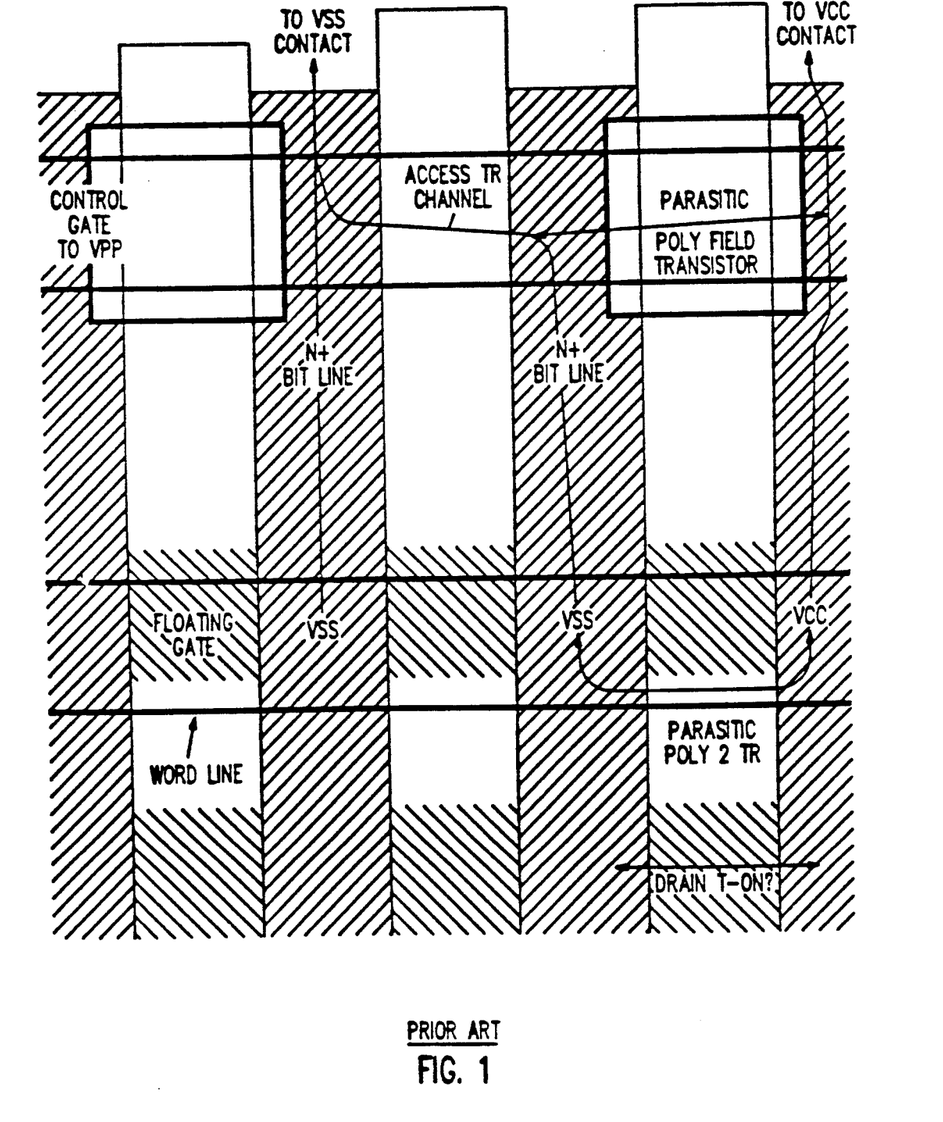
FIG. 1 is a layout illustrating a known cross-point EPROM cell structure.
Figure 2:
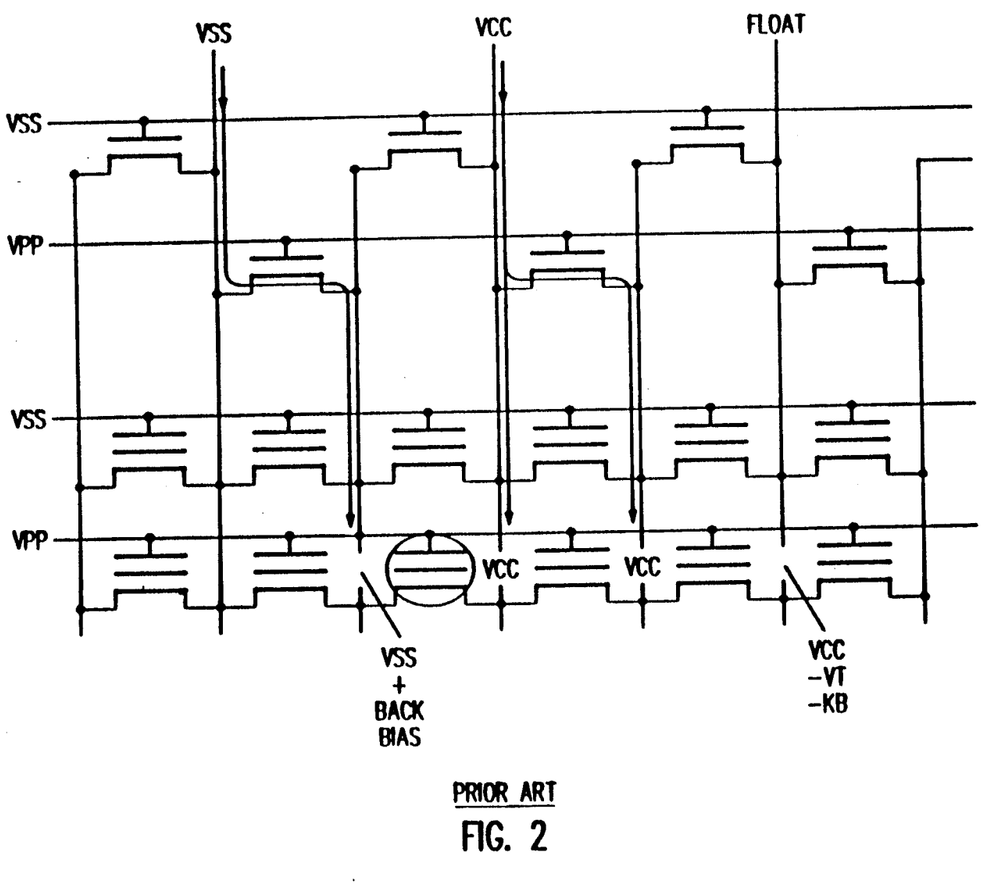
FIG. 2 is a schematic diagram illustrating an equivalent circuit for the cross-point EPROM cell structure shown in FIG. 1.

FIGS. 1 and 2 show the layout and the equivalent circuit schematic, respectively, of a known cross-point EPROM cell structure.

An improved process flow for the cell structure shown in FIGS. 1 and 2 is the subject of the above-mentioned Bergemont U.S. pat. application Ser. No. 687,176. The Bergemont process integrates high density EPROMs without using aggressive technologies. In the basic Bergemont process flow, a stacked etch is used so that floating gate edges are self-aligned to the word lines. This eliminates any possible parasitic poly2 transistors and removes all of the process steps previously required to cope with problems inherent in the approach utilized in the FIG. 1/2 array, such as the requirements for a special boron array field implant and for isolation oxide.

However, because the Bergemont process uses ONO control gate dielectric layers, it cannot be easily integrated at 64 Meg density levels and beyond. As stated above, this is due to the fact that the conventional ONO layer does not provide enough dielectric strength with an adequate coupling ratio required for programming and reading high-density EPROM cells. Also, in the Bergemont process, the ONO dielectric layers are exposed to n+ bit line implantation, which may result in degradation of dielectric integrity.

The FIG. 1/2 process, which protects the ONO during n+ bit line implantation by using a polysilicon, and nitride cap, is too complicated and requires two definitions of poly1. Furthermore, the high resistance of the polysilicide word line results in low-speed operation.

SUMMARY OF THE INVENTION

The present invention provides a process flow for fabricating a self-aligned stacked gate EPROM cell that uses a chemical vapor deposition (CVD) tantalum oxide film as a control gate dielectric, rather than conventional ONO composite films. Both the dielectric deposition and cell definition steps of the process flow are performed in a back-end module. Implementation of these steps at the back end of the process is important because the dielectric strength of tantalum oxide degrades after high temperature cycles (>1000° C.) for more than 30 minutes and high temperature cycles are required the earlier stages of the process. Also, low temperature deposition of the tantalum oxide at less than 450° C. has negligible effect on the peripheral devices. The use of tantalum oxide also enables the use of tungsten for the cell control gate, which improves device access time.

A better understanding of the features and advantages of the present invention will be obtained by reference to the following detailed description and accompanying drawings which set forth an illustrative embodiment in which the principles of the invention are utilized.

DESCRIPTION OF THE DRAWINGS

FIGS. 4 (a)-(c) through 8 (a)-(c) illustrate the progression of an EPROM process flow in accordance with the present invention.

DETAILED DESCRIPTION OF THE INVENTION

Figure 3:
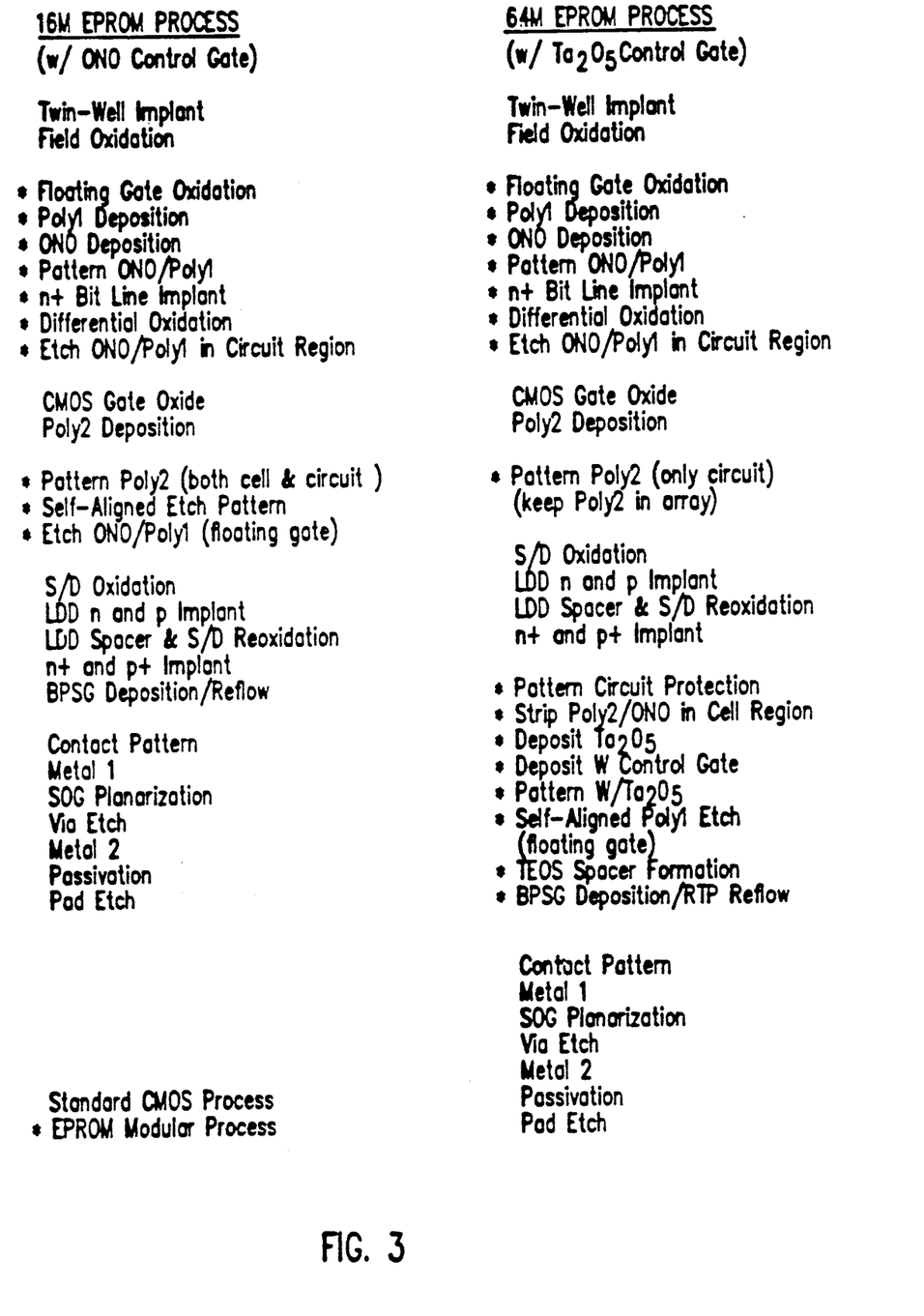
FIG. 3 is a table that provides a comparison between an EPROM process flow in accordance with the present invention and a prior art EPROM process flow.

FIG. 3 shows a process flow in accordance with the present invention for an EPROM cell array that utilizes $Ta_2O_5$ control gate dielectric compared to the prior art process flow for an EPROM cell array that utilizes ONO control gate dielectric. As shown in the FIG. 3 table, in the new $Ta_2O_5$ process, the control gate dielectric deposition and cell definition steps are performed after the peripheral CMOS circuit process steps are completed. The new process requires two additional masking steps compared to the prior art process: one to strip poly2/ONO in the cell region and one to separately define the word lines in the array.

FIGS. 4(a)-(b) through 8(a)-(b) show cross-sectional views of the cell array and of the access transistor portion of the device, for each step in the new process, taken along a word line in the array (i.e., the "(a)" cross-section) and along a bit line in the array (i.e., the "(b)" cross-section). FIGS. 4(c) through 8(c) provide tables that recite the process steps related to the corresponding.

Figure 4A:
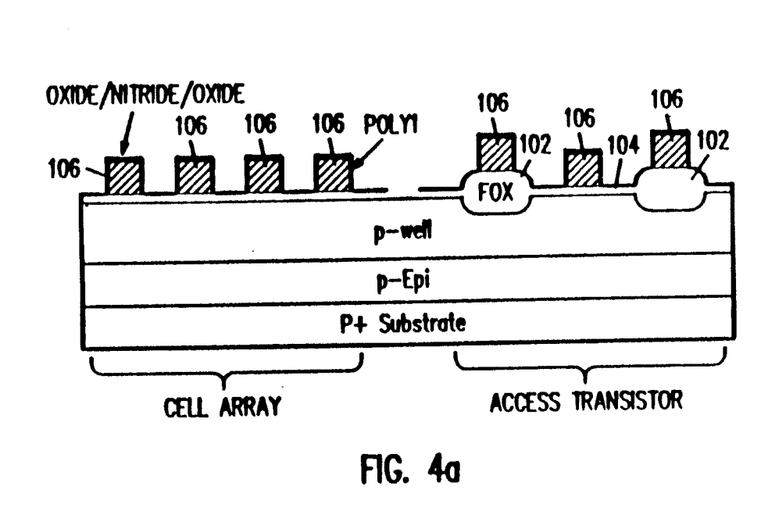
Figure 4B:
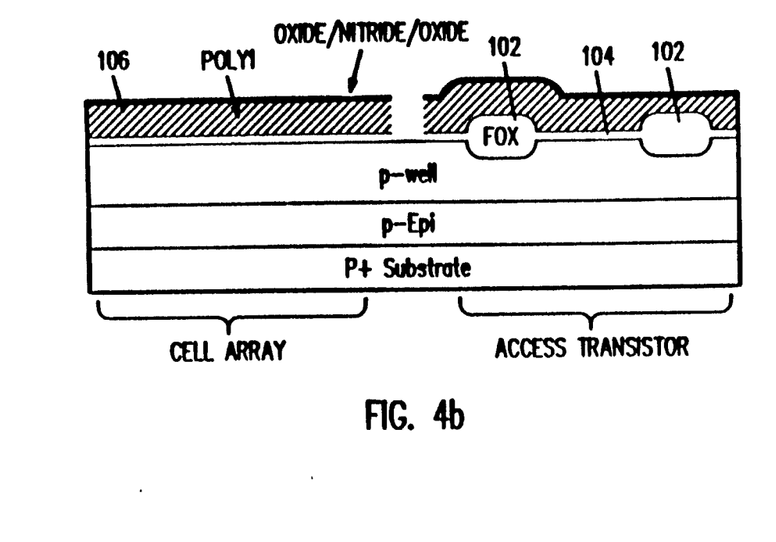
Figure 4C:
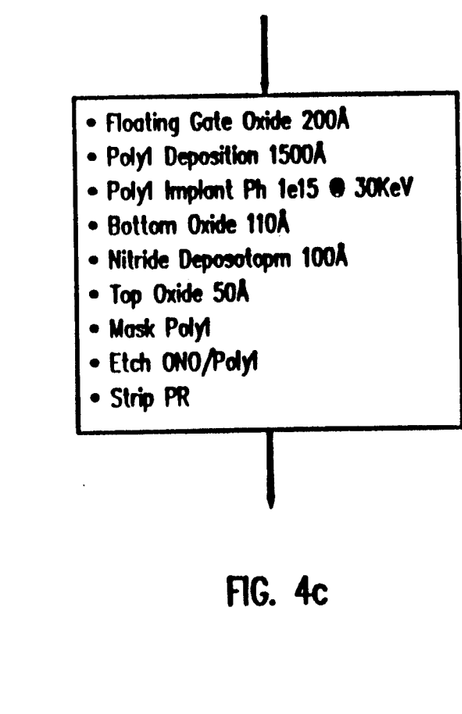

Referring to FIGS. 4(a)-(c), after formation of field oxide regions 102, a layer of floating gate oxide 104 is thermally grown in both the array and he access transistor portion as well as in the peripheral portion of the device. Growth of the oxide 104 followed by deposition and implantation of floating gate polysilicon (poly1). A composite layer of oxide-nitride-oxide (ONO) used for typical EPROM devices is then formed on the top of the poly1. The ONO layer protects the poly1 from further oxidation. A poly1 mask is then used to define stripes 106 of poly1/ONO by plasma etching in both the cell array and in the access transistor portion.

Figure 5A:
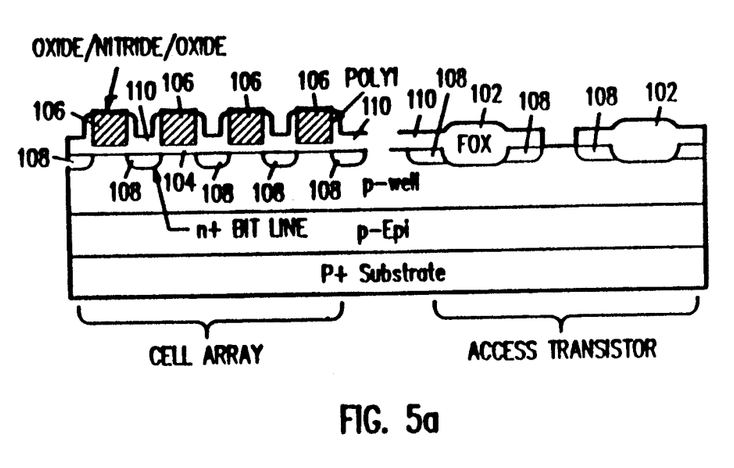
Figure 5B:
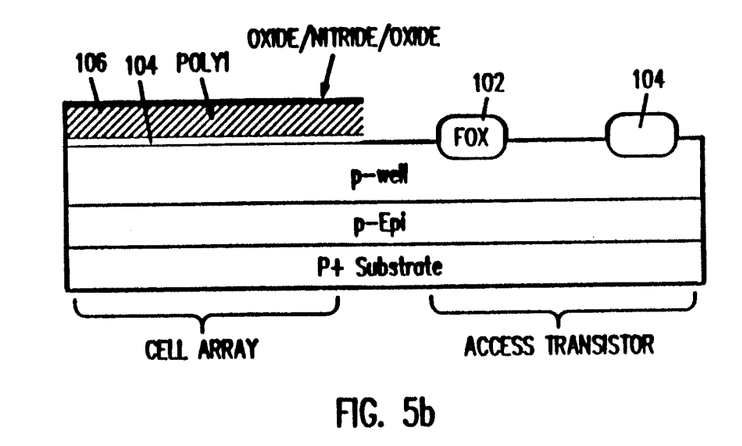
Figure 5C:
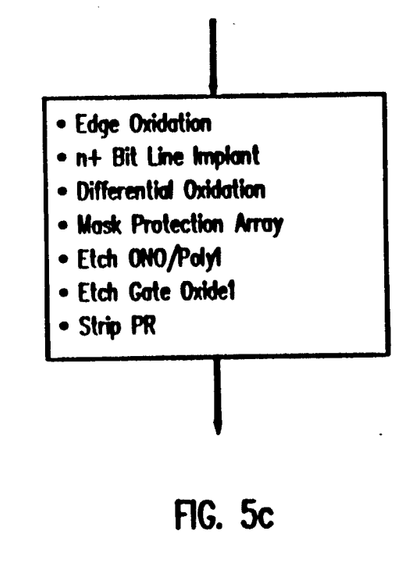

As shown in FIGS. 5(a)-(c), after stripping photoresist from the poly1 mask step, a thermal oxidation is performed to grow oxide on the poly1 sidewalls. A self-aligned arsenic implant is then performed to define n+ bit lines 108 in the cell array and the n+ source and drain regions 108 of the access transistors. A thick "differential oxide" 110 is then grown over the n+ bit lines 108 and source/drain regions 108 to achieve substantial latitude for the subsequent SAE (Self-Aligned Etch) steps in which the floating gate poly1 is plasma etched to be self-aligned to the control gate mask. An equivalent oxide loss during this poly etch can be tolerated in the n+ bit line region, because oxide growth in the n+ bit lines is significantly enhanced due to the introduction of impurities from implantation, leading to the "differential oxidation" designation for this step.

Figure 6A:
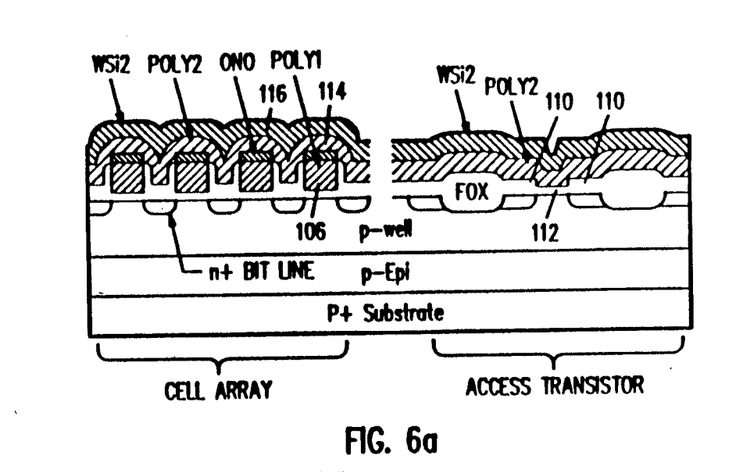
Figure 6B:
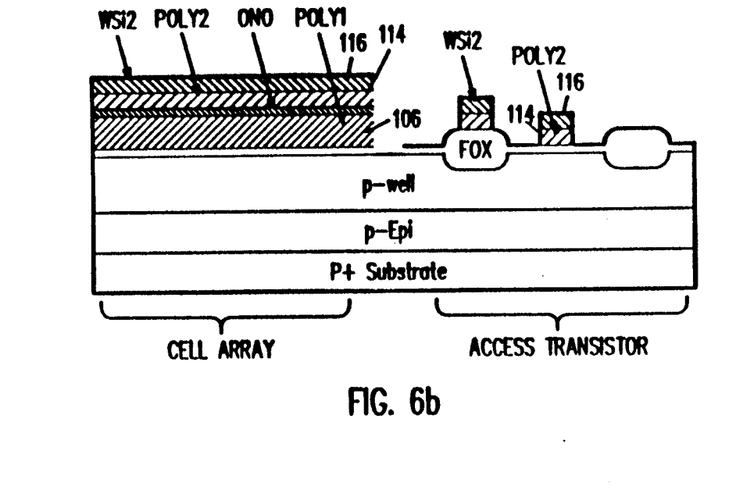
Figure 6C:
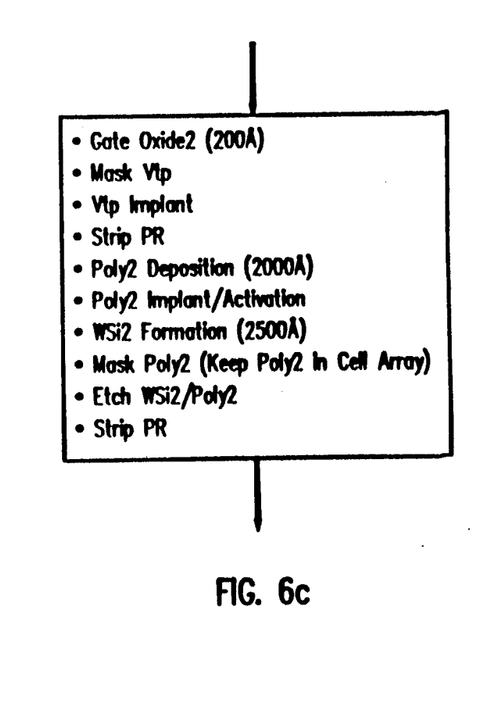

Next, a protect array mask is patterned to etch ONO/poly1 106 in the access transistor portion and in the periphery. The ONO/poly1 106 is plasma etched and the underlying floating gate oxide 104 is removed in wet chemistry (buffered HF). Then the protect array photoresist mask is stripped. Referring to FIGS. 6(a)-(c), after stripping the floating gate oxide in the access transistor portion and in the periphery, standard CMOS processes are performed to complete the array and to define the access transistors and the peripheral devices. Thermal gate oxide 112 is grown for both the access transistors and for the peripheral transistors, followed by $V_{TP}$ threshold implantation only in the peripheral region. A second layer 114 of polysilicon (poly2) is then deposited in all regions and doped to the appropriate conductivity. Tungsten silicide ($WSi_2$) 116 is then formed on the top of poly2 114 to reduce resistance for improving device speed. Then, the silicided poly2 114,116 is patterned and etched to define gates for both the access transistors and the peripheral devices. In this mask step, the silicided poly2 114,116 is masked in the cell array to protect it from source/drain implantation in the periphery and from reoxidation.

Figure 7A:
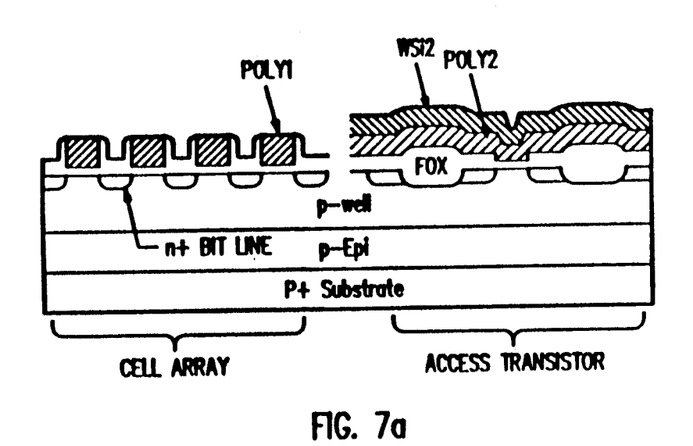
Figure 7B:
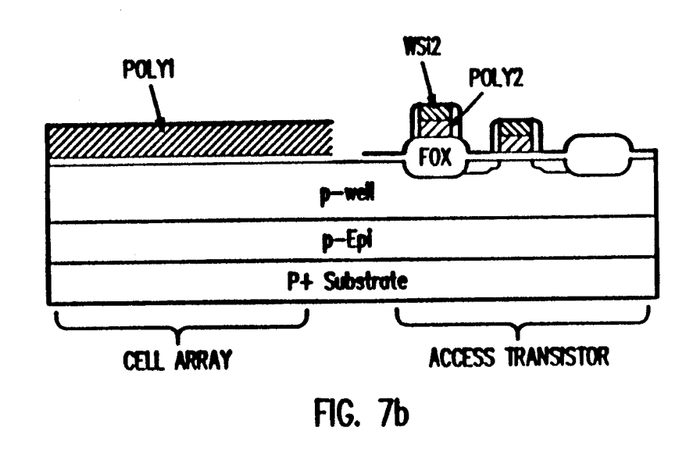
Figure 7C:
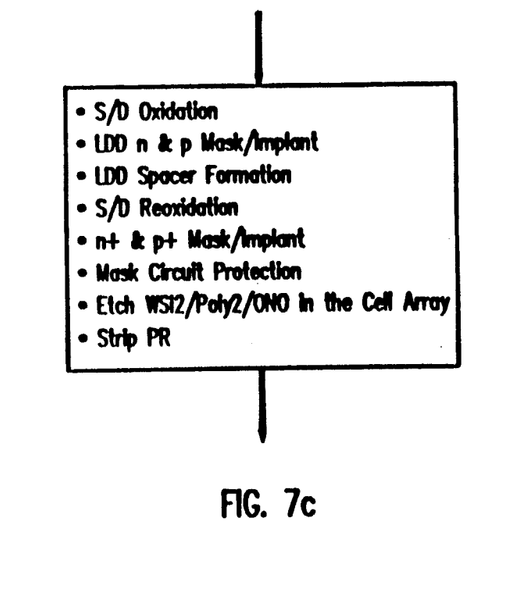

The source and drain regions of the peripheral transistors are then oxidized for LDD n and p implantations. After the LDD implantations, an LDD spacer is formed and the source and drain regions are reoxidized and followed by n+ and p+ source/drain implantation. Then, by using a circuit protection mask, as shown in FIGS. 7(a)-(c), the $WSi_2$/Poly2/ONO layers on the top of poly1 are etched in the cell array and photoresist is stripped.

Figure 8A:
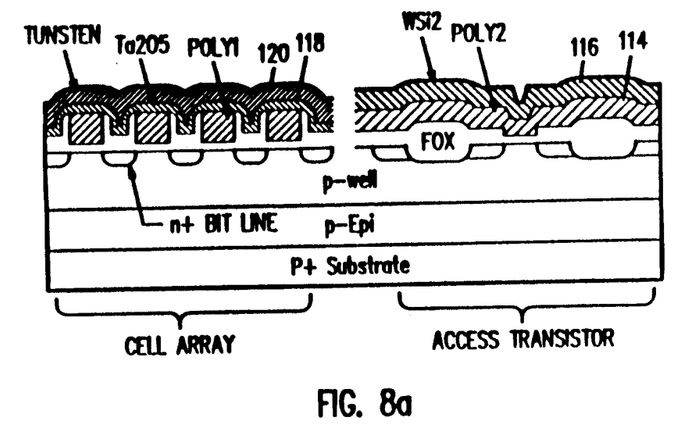
Figure 8B:
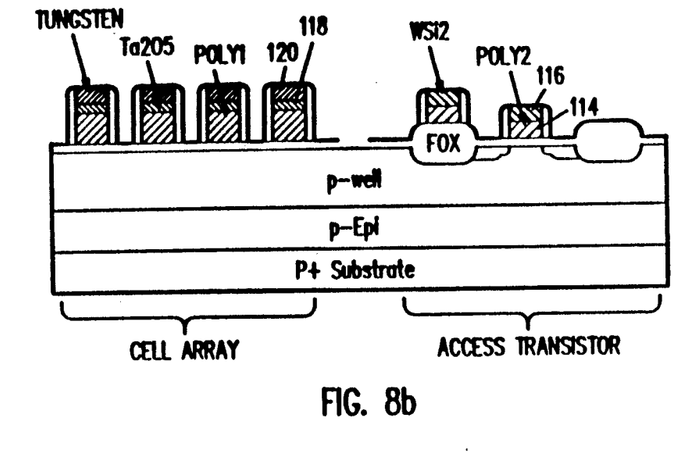
Figure 8C:
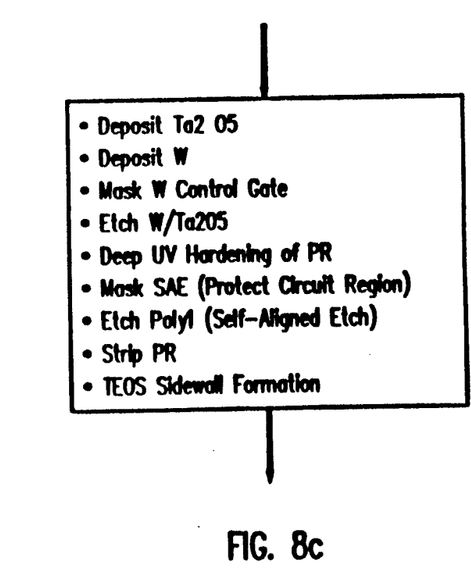

Referring to FIGS. 8(a)-(c), tantalum oxide dielectric 118 and conductive electrode material 120, e.g. tungsten or doped polysilicon, are then deposited consecutively. This process can be performed in a multi-chamber cluster tool including in-situ cleaning, deposition and annealing. The tantalum oxide film can be deposited by low pressure chemical vapor deposition (LPCVD) with a chamber pressure of 0.2-5 Torr at 300°-500° C. Tantalum ethoxide or tantalum chloride over 6N purity can be used as precursors. The reactor chamber can include a cold-wall type single-wafer process module with heated inlet gas lines for the vaporized precursor. Post-deposition annealing can be performed at 400°-900° C. in an oxygen environment. Then in the preformed embodiment, tungsten is deposited by chemical vapor deposition or by sputtering, followed by metal control gate definition (This is the only extra mask added over the prior art process).

After patterning, both the tungsten and tantalum oxide are plasma etched. After this etch, photoresist is not stripped. Instead, the photoresist is hardened by using deep UV light. A second layer of photoresist is then spun on top of the existing photoresist and patterned to protect the access transistors and the periphery by using an SAE mask, followed by self-aligned poly1 etch. During this etch process, exposed n+ bit lines are also etched. However, the thick differential oxide formed earlier in the process prevents the n+ bit lines from being overetched; the loss of oxide is tolerable due to high selectivity in the poly to oxide etch ratio. Next, photoresist is stripped and TEOS sidewall formation is performed to minimize any possible leakage current through the sidewall of the memory cell.

The rest of the remaining processes are typical final back-end metallization.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of fabricating an EPROM cell array in a silicon substrate, the method comprising the steps of:

forming a layer of floating gate oxide on the surface of the substrate in the cell array;

forming a first polysilicon layer (poly1) on the surface of the floating gate oxide in the cell array;

forming an oxide/nitride/oxide (ONO) layer on the surface of the first polysilicon layer in the cell array;

patterning the ONO layer and the underlying first polysilicon layer to define stripes of composite ONO/poly1 on the surface of the floating gate oxide in the cell array;

growing thermal oxide on exposed poly1 sidewalls of the composite ONO/poly1 stripes;

introducing n-type dopant material into the silicon substrate between the composite ONO/poly1 stripes to define n+ bit lines in the cell array;

growing a differential oxide over the n+ bit lines in the cell array;

stripping the ONO from the composite ONO/poly1 stripes in the cell array to expose poly1 stripes in the cell array portion;

depositing tantalum oxide over the poly1 stripes in the cell array portion; and depositing conductive material over the tantalum oxide.

2. A method as in claim 1 and comprising the further steps of patterning the conductive material/tantalum oxide to form conductive material/tantalum oxide strips on the underlying poly1 stripes in the cell array; and utilizing the conductive material/tantalum oxide strips in a self-aligned etch to define the underlying poly1 stripes to form the floating gates of the EPROM cells in the cell array.

3. A method as in claim 2 wherein the conductive material comprises tungsten.

4. A method as in claim 2 wherein the conductive material comprises doped polysilicon.

5. A method of fabricating an EPROM array in a silicon substrate, the EPROM array including a cell array portion and an access transistor portion, the method comprising:

forming field oxide regions in the access transistor portion to define active device regions;

forming a layer of floating gate oxide on the silicon substrate both in the cell array portion and in the active device regions;

forming a first polysilicon layer (poly1) on the floating gate oxide in the cell array portion and in the access transistor portion on both the field oxide regions and the floating gate oxide in the active device regions;

forming an oxide/nitride/oxide (ONO) layer on the poly1 layer in both the cell array portion and the access transistor portion;

patterning the ONO layer and the poly1 layer to define stripes of composite ONO/poly1 on the floating gate oxide in the cell array portion and on the field oxide and on the floating gate oxide in the access transistor portion;

growing thermal oxide on exposed poly1 sidewalls of the composite ONO/poly1 stripes;

introducing n-type dopant material into the silicon substrate between the composite ONO/poly1 stripes to define n+ bit lines in the cell array portion and n+ access transistor source and drain regions in the access transistor portion;

growing differential oxide over the n+ bit lines in the cell array portion and over the n+ source and drain regions in the access transistor portion;

forming a protect array mask over the cell array portion;

removing the composite ONO/poly1 stripes and the floating gate oxide in the access transistor portion to expose the silicon substrate in the active device regions;

removing the protect array mask;

forming thermal gate oxide on the silicon substrate in the active device regions;

forming a second polysilicon layer (poly2) in both the cell array portion and the access transistor portion;

forming a metal silicide layer on the second polysilicon layer in both the cell array portion and the access transistor portion;

patterning the metal silicide layer and the poly2 layer in the access transistor portion to define silicided poly2 access transistor gates on the gate oxide in the active device regions;

removing the metal silicide, poly2 and ONO in the cell array portion to expose poly1 stripes;

depositing tantalum oxide over the poly1 stripes; and depositing conductive material over the tantalum oxide.

6. A method as in claim 5 and comprising the further steps of:

forming a photoresist mask on the conductive material to define conductive material/tantalum oxide strips overlying the poly1 stripes in the cell array;

utilizing the photoresist mask to pattern the conductive material/tantalum oxide to form the conductive material/tantalum oxide strips on the underlying poly1 stripes in the cell array;

hardening the photoresist mask;

forming a self-aligned etch mask to protect the access transistor portion; and utilizing the hardened photoresist mask and the conductive material/tantalum oxide strips in a self-aligned etch to further define the underlying poly1 stripes to form the floating gates of the EPROM cells in the cell array.

7. A method as in claim 6 wherein the conductive material comprises tungsten.

8. A method as in claim 6 wherein the conductive material comprises doped polysilicon.

9. A method of fabricating an EPROM array in a silicon substrate, the EPROM array including a cell array portion, an access transistor portion and a peripheral circuit portion, the method comprising:

forming field oxide regions in the access transistor portion and the peripheral circuit portion to define active device regions therein;

forming a layer of floating gate oxide on the silicon substrate both in the cell array portion and in the active device regions;

forming a first polysilicon layer (poly1) on the floating gate oxide in the cell array portion, the access transistor portion and the peripheral circuit portion;

forming an oxide/nitride/oxide (ONO) layer on the poly1 layer in the cell array portion, the access transistor portion and the peripheral circuit portion;

patterning the ONO layer and the poly1 layer to define stripes of composite ONO/poly1 on the floating gate oxide in the cell array portion and on the field oxide and on the floating gate oxide in the access transistor portion, the peripheral circuit portion being covered with ONO/poly1 to protect the peripheral circuit portion in a subsequent n-type dopant diffusion;

growing thermal oxide on exposed poly1 sidewalls of the composite ONO/poly1 stripes;

introducing n-type dopant material into the silicon substrate between the composite ONO/poly1 stripes to define n+ bit lines in the cell array portion and n+ access transistor source and drain regions in the access transistor portion;

growing differential oxide over the n+ bit lines in the cell array portion and over the source and drain regions in the access transistor portion;

forming a protect array mask over the cell array portion;

removing the composite ONO/poly1 and the floating gate oxide in both the access transistor portion and the peripheral circuit portion to expose the silicon substrate in the active device regions therein;

removing the protect array mask and forming thermal gate oxide on the silicon substrate in the active device regions in both the access transistor portion and the peripheral circuit portion;

performing a p-type threshold implant in the peripheral circuit portion;

forming a second layer of polysilicon (poly2) over the cell array portion, the access transistor portion and the peripheral circuit portion;

forming a metal silicide layer on the second polysilicon layer in the cell array portion, the access transistor portion and the peripheral circuit portion;

patterning the metal silicide layer and the second polysilicon layer in the access transistor portion and the peripheral circuit portion to define silicided poly2 access transistor gate and peripheral transistor gates on the gate oxide in the active device regions of the access transistor portion and the peripheral circuit portion, respectively; the cell array portion being covered with silicided poly2 to protect the cell array portion in a subsequent source/drain implantation in the peripheral circuit portion;

oxidizing source and drain regions in the peripheral circuit portion;

performing LDD n and p implantations in the source and drain regions in the peripheral circuit portion;

forming an LDD spacer on the source and drain regions in the peripheral circuit portion;

performing a source/drain reoxidation in the peripheral circuit portion;

performing an n+ and p+ source/drain implantation in the peripheral circuit portion;

forming a mask to protect the access transistor portion and the peripheral circuit portion;

removing the metal silicide, poly2 and ONO in the cell array portion to expose poly1 stripes;

depositing a layer of tantalum oxide over the cell array portion, the access transistor portion and the peripheral circuit portion;

depositing a layer of conductive material over the tantalum oxide in the cell array portion, the access transistor portion and the peripheral circuit portion;

forming a photoresist mask on the layer of conductible material to define conductive material/tantalum oxide strips overlying the poly1 stripes in the cell array portion;

utilizing the photoresist mask to pattern the conductible material/tantalum oxide to form the conductive material/tantalum oxide strips on the underlying poly1 stripes;

hardening the photoresist mask;

forming a self-aligned etch mask to protect the access transistor portion and the peripheral circuit portion; and utilizing the hardened photoresist mask and the conductive material/tantalum oxide strips in a self-aligned etch to further define the underlying poly1 stripes to form the floating gates of the EPROM cells in the cell array portion.

10. A method as in claim 9 wherein the conductive material comprises tungsten.

11. A method as in claim 9 wherein the conductive material comprises doped polysilicon.

12. A method as in claim 5 wherein the conductive material comprises doped polysilicon.

* * * * *